US012596857B2

(12) United States Patent
Chen et al.

(10) Patent No.: US 12,596,857 B2
(45) Date of Patent: Apr. 7, 2026

(54) METHOD, APPARATUS AND DEVICE FOR OPTIMIZING PROCESS PARAMETER, AND STORAGE MEDIUM

(71) Applicants: COSMO INSTITUTE OF INDUSTRIAL INTELLIGENCE (QINGDAO) CO., LTD., Qingdao (CN); COSMOPlat IoT Technology Co., Ltd., Qingdao (CN)

(72) Inventors: Lucheng Chen, Qingdao (CN); Deyan Liu, Qingdao (CN); Chao Wang, Qingdao (CN); Chenggang Qin, Qingdao (CN); Lin Wang, Qingdao (CN); Qingze Tian, Qingdao (CN); Xiang Li, Qingdao (CN)

(73) Assignees: COSMO INSTITUTE OF INDUSTRIAL INTELLIGENCE (QINGDAO) CO., LTD., Qingdao (CN); COSMOPlat IoT Technology Co., Ltd., Qingdao (CN)

( * ) Notice: Subject to any disclaimer, the term of this patent is extended or adjusted under 35 U.S.C. 154(b) by 0 days.

(21) Appl. No.: 19/175,628

(22) Filed: Apr. 10, 2025

(65) Prior Publication Data

US 2025/0335667 A1 Oct. 30, 2025

(30) Foreign Application Priority Data

Apr. 24, 2024 (CN) .......................... 202410494603.5

(51) Int. Cl.
*G06F 30/27* (2020.01)

(52) U.S. Cl.
CPC .................................... *G06F 30/27* (2020.01)

(58) Field of Classification Search
CPC ...................................................... G06F 30/27
See application file for complete search history.

(56) References Cited

U.S. PATENT DOCUMENTS 11,860,590 B2 1/2024 Zhao et al.
2003/0101161 A1* 5/2003 Ferguson ........... G05B 13/0265
(Continued)

FOREIGN PATENT DOCUMENTS

CN 104772878 A 7/2015
CN 111240282 A 6/2020
(Continued)

OTHER PUBLICATIONS

Notification of Grant of Patent Rights for Inventions for Chinese Application No. 202410494603.5, dated Jul. 10, 2024; 6 pages.
(Continued)

*Primary Examiner* — Tameem D Siddiquee
(74) *Attorney, Agent, or Firm* — Quarles & Brady LLP

(57) ABSTRACT

The present application pertains to the field of data processing technology, specifically relates to a method, apparatus and device for optimizing a process parameter and a storage medium, which includes: using a first weight parameter of a pre-trained support vector regression model for a manufacturing equipment as an iterative initial value, and calculating a second weight parameter of a support vector regression model using an online proximal gradient algorithm based on training data; obtaining an optimized support vector regression model by updating the first weight parameter of the pre-trained support vector regression model to the second weight parameter; inputting a first process parameter of the manufacturing equipment into the optimized support vector regression model to obtain a first detection parameter output by the optimized support vector regression model; and calculating, according to the first process parameter and the first detection parameter, a target process parameter for the manufacturing equipment.

20 Claims, 3 Drawing Sheets

(56) References Cited

U.S. PATENT DOCUMENTS

| 2015/0262083 A1* | 9/2015 | Xu | G06N 20/10 |
| | | | 706/12 |
| 2019/0026602 A1 | 1/2019 | Leng et al. | |
| 2020/0201282 A1* | 6/2020 | Wang | G05B 19/18 |
| 2025/0137414 A1* | 5/2025 | Borhan | B60W 10/08 |

FOREIGN PATENT DOCUMENTS

| CN | 113505914 A | 10/2021 |
| CN | 114912368 A | 8/2022 |
| CN | 117688744 A | 3/2024 |

OTHER PUBLICATIONS

Office Action for Chinese Application No. 202410494603.5, dated Jun. 4, 2024; 9 pages.

Wang Ru, et al. ; "IFC Component Classification and Identification Review Method Based on Improved MVCNN"; Journal of Hunan University (Natural Sciences); Nov. 2023; 9 pages; vol. 50, No. 11. China Academic Journal Electronic Publishing House.

"On stochastic proximal stochastic subgradient algorithm for stochastic composite optimization"; Dalian University of Technology; Jul. 2021; 36 pages; China Academic Journal Electronic Publishing House.

* cited by examiner

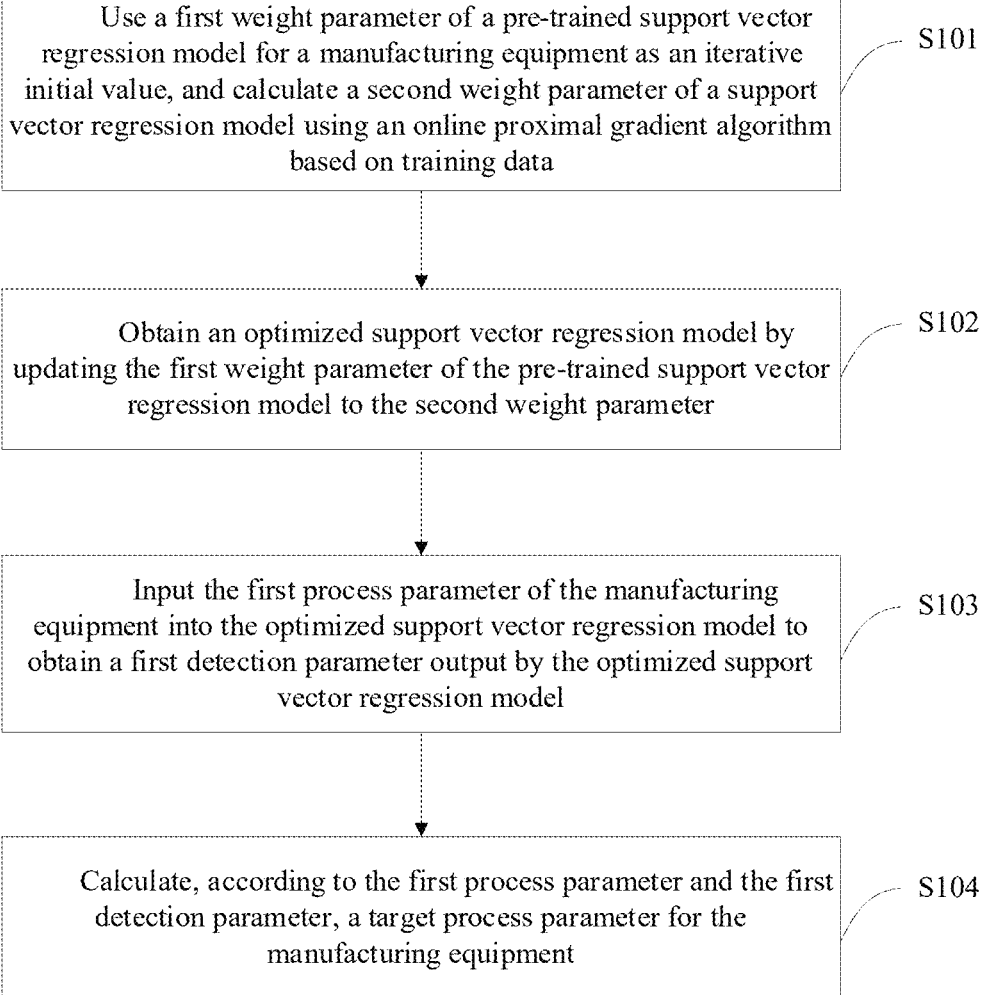

Use a first weight parameter of a pre-trained support vector regression model for a manufacturing equipment as an iterative initial value, and calculate a second weight parameter of a support vector regression model using an online proximal gradient algorithm based on training data — S101

Obtain an optimized support vector regression model by updating the first weight parameter of the pre-trained support vector regression model to the second weight parameter — S102

Input the first process parameter of the manufacturing equipment into the optimized support vector regression model to obtain a first detection parameter output by the optimized support vector regression model — S103

Calculate, according to the first process parameter and the first detection parameter, a target process parameter for the manufacturing equipment — S104

FIG. 1

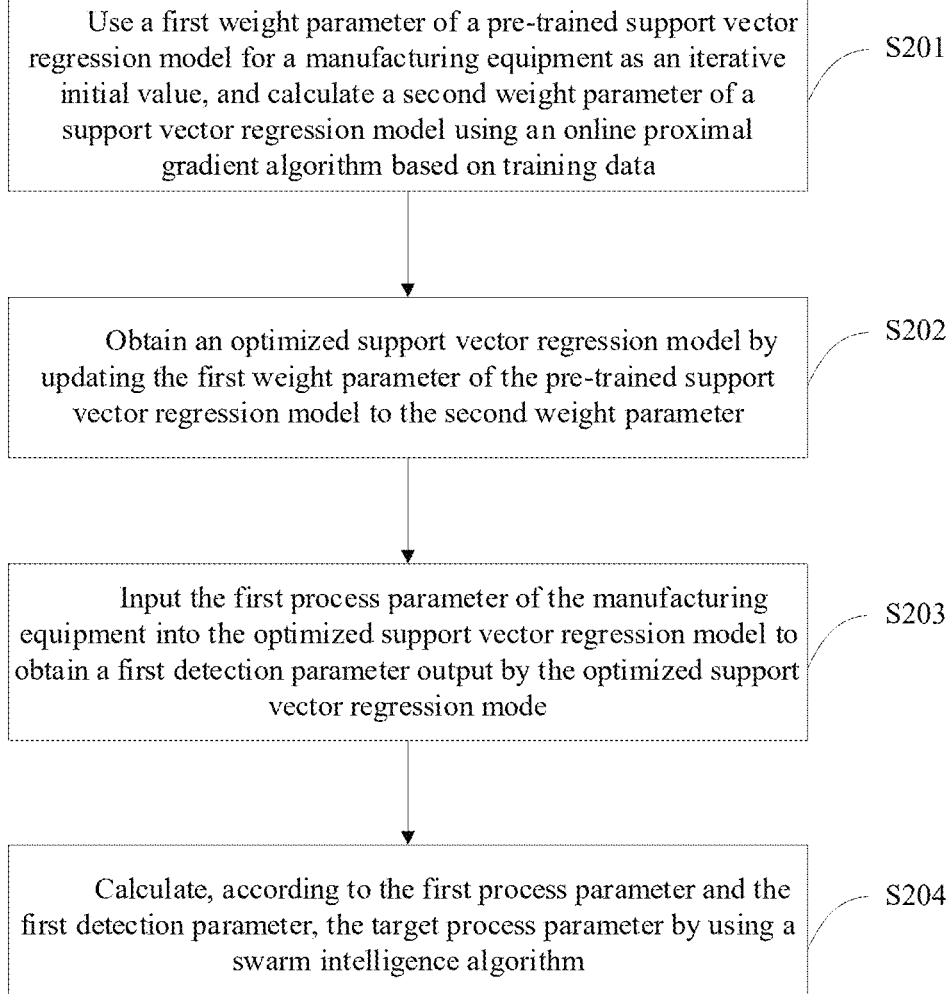

Use a first weight parameter of a pre-trained support vector regression model for a manufacturing equipment as an iterative initial value, and calculate a second weight parameter of a support vector regression model using an online proximal gradient algorithm based on training data — S201

Obtain an optimized support vector regression model by updating the first weight parameter of the pre-trained support vector regression model to the second weight parameter — S202

Input the first process parameter of the manufacturing equipment into the optimized support vector regression model to obtain a first detection parameter output by the optimized support vector regression mode — S203

Calculate, according to the first process parameter and the first detection parameter, the target process parameter by using a swarm intelligence algorithm — S204

FIG. 2

METHOD, APPARATUS AND DEVICE FOR OPTIMIZING PROCESS PARAMETER, AND STORAGE MEDIUM

CROSS-REFERENCE TO RELATED APPLICATIONS

This application claims priority to Chinese Patent Application No. 202410494603.5, filed on Apr. 24, 2024, which is hereby incorporated herein by reference in its entirety.

TECHNICAL FIELD

The present application relates to the field of data processing technology, and specifically to a method, apparatus and device for optimizing a process parameter and a storage medium.

BACKGROUND

Energy consumption problems, product yield, and production efficiency in a production process of an injection molding machine have always been key concerns for injection molding enterprises. With the introduction of Industry 4.0, intelligent factories utilize various sensors to collect a large amount of valuable real-time data during production, enabling the possibility of data-based intelligent production control, particularly for automated detection and prediction of detection parameters such as energy consumption, product quality, and production cycles. Through data mining and analysis, key factors influencing these detection parameters are identified, and big data from the production process is leveraged to achieve comprehensive quality inspection and energy conservation, eliminating the lag associated with manual parameter adjustment methods. Due to the cyclical nature of the injection molding process, tracking the injection molding process plays a crucial role in achieving the automated prediction of the detection parameters and process feedback recommendations.

The existing methods for optimizing process parameters mainly consist of two steps. The first step is to establish a multivariate relationship model between process parameters and detection parameters (quality, energy consumption, cycle time) as a process parameter optimization model, thereby enabling accurate predictions of the detection parameters. The second step involves formulating an optimization problem based on the relationship model and specific requirements, such as minimizing energy consumption, shortening cycle time, maximizing product yield, etc. Parameter optimization algorithm is applied to solve this problem and obtain the final recommended optimal process parameters.

It is evident that the prior art typically establishes a multivariate relationship model between process parameters and detection parameters first, and then formulates a target optimization problem based on the relationship model function and actual demands. By solving the target optimization problem, feedback control of the process parameters is achieved. However, when faced with new production scenarios or a new set of process parameters, the existing process parameters optimization methods require re-training of the optimization model to adapt to the new operating conditions. In such cases, if the entire dataset is re-trained directly, the computational complexity and time required are high, leading to significantly increased computational costs over time, which is unsuitable for real-time production scenarios. Alternatively, if only the data from the recent period is re-trained, while the training time is reduced compared to using the entire dataset, it results in the loss of many key feature information from past processes, affecting the accuracy of prediction and optimization recommendations.

SUMMARY

The present application provides a method, apparatus and device for optimizing a process parameter and a storage medium, aimed at solving the technical problems in the prior art. When confronted with new production scenarios or new process parameters, the process parameter model requires re-training on the entire dataset, leading to high computational complexity and long duration, which is unsuitable for real-time production scenarios, or it only re-trains on new data, causing the loss of many key feature information from past processes and reducing the accuracy of prediction and optimization.

In a first aspect, the present application provides a method for optimizing a process parameter, the method includes:

using a first weight parameter of a pre-trained support vector regression model for a manufacturing equipment as an iterative initial value, and calculating a second weight parameter of a support vector regression model using an online proximal gradient algorithm based on training data, where the training data includes: a historical process parameter of the manufacturing equipment, and a historical detection parameter corresponding to when the manufacturing equipment operates with the historical process parameter;

obtaining an optimized support vector regression model by updating the first weight parameter of the pre-trained support vector regression model to the second weight parameter;

inputting a first process parameter of the manufacturing equipment into the optimized support vector regression model to obtain a first detection parameter output by the optimized support vector regression model; and calculating, according to the first process parameter and the first detection parameter, a target process parameter for the manufacturing equipment.

In a technical solution of the aforementioned method for optimizing the process parameter, using the first weight parameter of the pre-trained support vector regression model for the manufacturing equipment as the iterative initial value, and calculating the second weight parameter of the support vector regression model using the online proximal gradient algorithm based on the training data includes:

calculating the second weight parameter by using a linear iterative formula with the first weight parameter as the iterative initial value when the pre-trained support vector regression model is a linear support vector regression model, and the linear iterative formula is:

$$w_{k+1} = \frac{w_k - \beta \lambda t_k x_k \operatorname{sign}(w_k^T x_k - y_k) \max(0, |w_k^T x_k - y_k| - \varepsilon)^{\beta-1}}{1 + t_k}$$

where $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, and ε represents an insensitive coefficient of the support vector regression model.

In a technical solution of the aforementioned method for optimizing the process parameter, using the first weight parameter of the pre-trained support vector regression model for the manufacturing equipment as the iterative initial value, and calculating the second weight parameter of the support vector regression model using the online proximal gradient algorithm based on the training data includes:

calculating the second weight parameter by using a non-linear iterative formula with the first weight parameter as the iterative initial value when the pre-trained support vector regression model is a nonlinear support vector regression model, and the linear iterative formula is:

$$w_{k+1} = \frac{w_k - \beta\lambda t_k \phi(x_k)\mathrm{sign}(w_k^T\phi(x_k) - y_k)\max(0, |w_k^T\phi(x_k) - y_k| - \varepsilon)^{\beta-1}}{1 + t_k}$$

where $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, β represents an order of a penalty function, λ represents a penalty factor of the penalty function, $x_k$ represents the historical process parameter, $y_k$ represents the historical detection parameter corresponding to $x_k$, ε represents an insensitive coefficient of the support vector regression model, and $\phi(x_k)$ represents a kernel mapping function.

In a technical solution of the aforementioned method for optimizing the process parameter, calculating, according to the first process parameter and the first detection parameter, the target process parameter for the manufacturing equipment includes:

calculating, according to the first process parameter and the first detection parameter, the target process parameter by using a swarm intelligence algorithm.

In a technical solution of the aforementioned method for optimizing the process parameter, calculating, according to the first process parameter and the first detection parameter, the target process parameter by using the swarm intelligence algorithm includes:

calculating, according to the first process parameter and the first detection parameter, with a historical optimal process parameter of the manufacturing equipment as an initial position parameter for the swarm intelligence algorithm, the target process parameter through the swarm intelligence algorithm.

In a technical solution of the aforementioned method for optimizing the process parameter, calculating, according to the first process parameter and the first detection parameter, with the historical optimal process parameter of the manufacturing equipment as the initial position parameter for the swarm intelligence algorithm, the target process parameter through the swarm intelligence algorithm includes:

determining, according to a target optimization type of the first detection parameter, a target historical optimal process parameter corresponding to the target optimization type in the historical optimal process parameter of the manufacturing equipment; and calculating, according to the first process parameter and the first detection parameter, with the target historical optimal process parameter as the initial position parameter for the swarm intelligence algorithm, the target process parameter through the swarm intelligence algorithm.

In a technical solution of the aforementioned method for optimizing the process parameter, calculating, according to the first process parameter and the first detection parameter, with the target historical optimal process parameter as the initial position parameter for the swarm intelligence algorithm, the target process parameter through the swarm intelligence algorithm includes:

calculating, according to the first process parameter and the first detection parameter, with the target historical optimal process parameter as an initial position parameter for a particle swarm optimization algorithm, the target process parameter through the particle swarm optimization algorithm.

In a second aspect, the present application provides an apparatus for optimizing a process parameter, the apparatus includes:

a model training module, configured to:
use a first weight parameter of a pre-trained support vector regression model for a manufacturing equipment as an iterative initial value, and calculating a second weight parameter of a support vector regression model using an online proximal gradient algorithm based on training data, where the training data includes: a historical process parameter of the manufacturing equipment, and a historical detection parameter corresponding to when the manufacturing equipment operates with the historical process parameter; and
obtain an optimized support vector regression model by updating the first weight parameter of the pre-trained support vector regression model to the second weight parameter;

a parameter optimization module, configured to:
input a first process parameter of the manufacturing equipment into the optimized support vector regression model to obtain a first detection parameter output by the optimized support vector regression model; and
calculate, according to the first process parameter and the first detection parameter, a target process parameter for the manufacturing equipment.

In a third aspect, the present application provides a process parameters optimization device, the device includes:

a processor and a memory;
the memory is configured to store a computer program; and
the processor is configured to execute the computer program stored in the memory to implement the method for optimizing the process parameter.

In a fourth aspect, the present application provides a readable storage medium, the readable storage medium stores a computer program; the computer program is used for implementing the method for optimizing the process parameter.

The technical effect of the method, apparatus and device for optimizing a process parameter and the storage medium provided by the present application is:

the characteristic of the online proximal gradient algorithm is that it can use single or small batches of sampled data to iteratively solve for the parameters in the objective function. In the present application, the weight parameter of a previously pre-trained support vector regression model is used as the iterative initial value, and a new weight parameter for the support vector regression model can be iteratively calculated using the online proximal gradient algorithm with small batches of new training data. The weight parameter determines the prediction accuracy of the support vector regression model. Therefore, through the method proposed in the present application, the weight parameter of the support vector regression model can be updated and optimized using historical weight parameter and small batches of new training data. On one hand, there is no need to re-train the entire dataset, resulting in low computational complexity, short computation times, and suitability for real-time production scenarios. On the other hand, by iteratively optimizing the weight parameter based on the historical weight parameter, both the key feature information from past processes is retained and optimizations based on new training data are made, leading to high prediction and optimization accuracy.

BRIEF DESCRIPTION OF DRAWINGS

Drawings are incorporated into and form a part of the present description, illustrate embodiments consistent with the present application, and are used in conjunction with the present description to explain the principles of the present application.

FIG. 1 is a flowchart of a method for optimizing a process parameter provided by an embodiment of the present application.

FIG. 2 is a flowchart of another method for optimizing a process parameter provided by an embodiment of the present application.

Figures 3, 4:
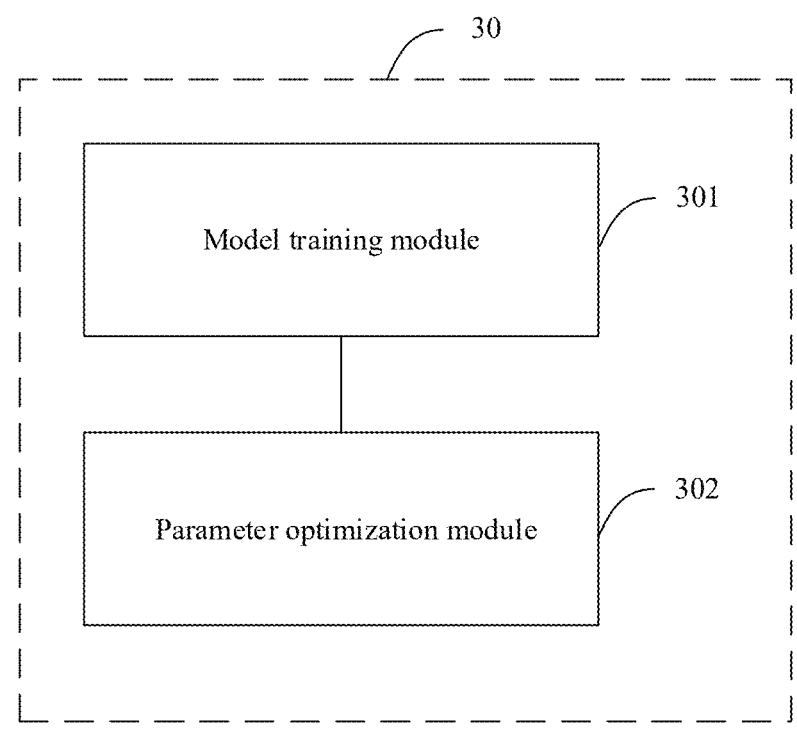
FIG. 3 is a schematic diagram of an apparatus for optimizing a process parameter provided by an embodiment of the present application.
FIG. 4 is a schematic diagram of a device for optimizing a process parameter provided by an embodiment of the present application.

Through the aforementioned figures, explicit embodiments of the present application have been illustrated, and more detailed descriptions will follow in the subsequent text. These figures and textual descriptions are not intended to limit the scope of the inventive concept of the present application in any way, but rather to explain the concepts of the present application to those skilled in the art by referencing specific embodiments.

DESCRIPTION OF EMBODIMENTS

To make the objectives, technical solutions, and advantages of embodiments of the present application clearer, the following clearly and comprehensively describes the technical solutions in embodiments of the present application with reference to the accompanying drawings in embodiments of the present application. Apparently, the described embodiments are merely a part rather than all embodiments of the present application. All other embodiments obtained by persons of ordinary skill in the art based on embodiments of the present application without creative effort shall fall within the protection scope of the present application.

The terms "first," "second," "third," "fourth," etc. (if present) in the specification, claims, and accompanying drawings of the present invention are used to distinguish similar objects and do not necessarily indicate a specific order or sequence. It should be understood that such data can be interchanged under appropriate circumstances, so that the embodiments of the present invention described here can be implemented in sequences other than those illustrated or described here.

In the embodiments of the present application, terms such as "exemplary" or "for example" are used to indicate examples, illustrations, or explanations. Any embodiment or design described in the present application as "exemplary" or "for example" should not be interpreted as being more preferred or advantageous than other embodiments or designs. Rather, the use of terms such as "exemplary" or "for example" is intended to present the relevant concepts in a concrete manner.

In the intelligent factory, the optimization of process parameters for manufacturing equipment, such as injection molding machines, typically involves the following steps:

the historical process parameters of the manufacturing equipment, along with the corresponding historical detection parameters (production quality, production cycle, production energy consumption), are input into an offline parameter model for training. This step primarily involves calculating the weight parameters of the offline parameter model, so that the model can fit and calculate the corresponding detection parameters based on the given process parameter data;

a batch of randomly generated process parameters is input into the offline parameter model, and the offline parameter model outputs the corresponding detection parameters;

based on the randomly generated process parameters and the detection parameters described above, and according to the target optimization problem (such as optimizing production quality, production cycle, or production energy consumption), the optimal process parameters are calculated and applied to actual production.

However, in actual production within the intelligent factory, the production conditions are complex and ever-changing. Process engineers may adjust the process parameters, or there may be temporary changes in production requirements, leading to the emergence of single or small batches of new process parameter data and detection parameters. Traditional offline parameter models require a large amount of training data for training. In the case of the aforementioned single or small batches of new training data, the following issues arise:

if all the data is re-trained directly, the computational complexity is high and the process is time-consuming, leading to a significant increase in computational costs over time, which is unsuitable for real-time production scenarios. If only the data from a recent period is re-trained, the training time will be reduced compared to training with all the data, but it will result in the loss of many key feature information from past processes, affecting the accuracy of prediction and optimization recommendations.

Therefore, to solve the aforementioned technical problems, the technical concept of the present application is:

after obtaining new training data, based on this data, the first weight parameter of a pre-trained support vector regression model are used as the iterative initial value, and the online proximal gradient algorithm is employed to calculate the second weight parameter. The second weight parameter are then used as the weight parameter of the support vector regression model, resulting in an optimized support vector regression model. This optimized support vector regression model is utilized to predict the detection parameter corresponding to the process parameter. Based on the process parameter and the predicted detection parameter, the process parameter are optimized, and the target process parameter are calculated.

The following provides a detailed explanation of the technical solution of the present application and how it addresses the aforementioned technical problems through specific embodiments. These specific embodiments below can be combined with each other, and for identical or similar concepts or processes, they may not be repeated in some embodiments. The embodiments of the present application will be described with reference to the accompanying drawings.

In a possible embodiment of the present application, a method for optimizing a process parameter is provided, which can be applied to a server. FIG. 1 is a flowchart of a method for optimizing a process parameter provided in an embodiment of the present application. As shown in FIG. 1, the method includes the following steps.

Step 101, use a first weight parameter of a pre-trained support vector regression model for a manufacturing equipment as an iterative initial value, and calculate a second weight parameter of a support vector regression model using an online proximal gradient algorithm based on training data.

Specifically, the training data includes: a historical process parameter of the manufacturing equipment, and a historical detection parameter corresponding to when the manufacturing equipment operates with the historical process parameter. Taking an injection molding machine as an example, the process parameters of the manufacturing equipment may include injection filling parameters, pressure holding parameters, plasticizing parameters, cooling parameters, etc., while the detection parameters may include product quality, energy consumption per unit product, cycle time per unit product, etc. Before using the training data to calculate the second weight parameter, it is first necessary to perform data screening, feature selection, and feature normalization on the training data to improve the accuracy of process parameter optimization.

The main idea of support vector regression (SVR) is to seek a regression model that maximizes the margin while tolerating differences between f(x) and y that are less than $\varepsilon$, for example:

$$f(x) = w^T \phi(x) + b$$

where w and b are the weight parameter and the bias parameter, respectively. In fact, the main objective of training an SVR is to calculate the weight parameter. Traditional SVR is often an offline model that requires large-scale training data to compute the weight parameter.

In this embodiment, the online proximal gradient (OPG) algorithm is used to calculate the weight parameter. The online proximal gradient algorithm is an iterative algorithm characterized by its ability to process data in real-time through single or small-batch sampling data. That is, using the online proximal gradient algorithm allows for iterative calculation of the weight parameter with only single or small batches of training data, avoiding the drawback of long retraining times associated with traditional offline SVR. At the same time, it ensures that the trained SVR aligns with real-time actual process parameter. Furthermore, when iteratively calculating the second weight parameter using the online proximal gradient algorithm, the first weight parameter of the pre-trained SVR is used as the iterative initial value, which helps to retain past process characteristics and improve the accuracy of process parameter prediction and optimization recommendations.

Step 102, obtain an optimized support vector regression model by updating the first weight parameter of the pre-trained support vector regression model to the second weight parameter.

Step 103, input a first process parameter of the manufacturing equipment into the optimized support vector regression model to obtain a first detection parameter output by the optimized support vector regression model.

Step 104, calculate, according to the first process parameter and the first detection parameter, a target process parameter for the manufacturing equipment.

In one possible embodiment of the present application, a method for calculating the second weight parameters is provided, which includes:

calculate the second weight parameter by using a linear iterative formula with the first weight parameter as the iterative initial value when the pre-trained support vector regression model is a linear support vector regression model. The linear iterative formula is:

$$w_{k+1} = \frac{w_k - \beta \lambda t_k x_k \mathrm{sign}(w_k^T x_k - y_k) \max(0, |w_k^T x_k - y_k| - \varepsilon)^{\beta-1}}{1 + t_k}$$

where $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, and $\varepsilon$ represents an insensitive coefficient of the support vector regression model.

The derivation principle of the linear iterative formula is as follows:

for the training data D={$(x_1, y_1), (x_2, y_2), \ldots, (x_m, y_m)$}, the constrained optimization problem for linear SVR is:

$$\min_{w,b} \frac{1}{2} \|w\|^2$$

$$\mathrm{s.t.}$$

$$|w^T x_i + b - y_i| \le \varepsilon, i = 1, 2, \ldots, m$$

Using the exterior penalty function method, the above-mentioned constrained optimization problem is transformed into an unconstrained optimization problem:

$$\min_{w,b} \frac{1}{2} \|w\|^2 + \sum_{i=1}^m \lambda_i \max(0, |w^T x_i + b - y_i| - \varepsilon)^\beta$$

where $\lambda_i$ is the penalty factor (usually taken as the same constant), $\beta \ge 1$. When $\beta=1$, $\max(0, |w^T x_i+b-y_i|-\varepsilon)$ is the loss function; when $\beta=2$, $\max(0, |w^T x_i+b-y_i|-\varepsilon)^2$ is the loss function, and the value of $\beta$ depends on the structural characteristics of the dataset.

To simplify the solution process, the original weight vector w and the feature vector x are expanded, with the notation remaining the same, i.e., $w=(w^{(1)}, w^{(2)}, \ldots, w^{(n)}, b)^T$ and $x=(x^{(1)}, x^{(2)}, \ldots, x^{(n)}, 1)^T$, where $w^{(i)}$, $x^{(1)}$ (i=1, . . . , n) represent the i-th component of the original weight vector w and feature vector x, respectively. Let the penalty factor be $\lambda/m$, then the above unconstrained optimization problem can be expressed as:

$$\min_{w} \frac{1}{2}\|w\|^2 + \sum_{i=1}^{m} \frac{\lambda}{m} \max\left(0, \left|w^T x_i - y_i\right| - \varepsilon\right)^{\beta}$$

For this optimization problem, the online proximal gradient algorithm is employed in this embodiment to find the solution. Firstly, based on knowledge of probabilistic statistics, the objective function is approximately transformed into the following form:

$$\min_{w} E_{(X,Y)}[h(w; x, y)] + g(w)$$

$$g(w) = \frac{1}{2}\|w\|^2$$

$$h(w; x, y) = \lambda \max\left(0, \left|w^T x - y\right| - \varepsilon\right)^{\beta}$$

where g(w) is the regularization term, h(w; x, y) is the loss function, (X, Y) is a random variable with an unknown distribution but sample observations are available. g(w) is a strongly convex function, and h(w; x, y) is a sub-differentiable convex function. Therefore, the above stochastic optimization problem can be solved by the online proximal gradient algorithm, resulting in:

$$w_{k+1} = prox_{t_k g}(w_k - t_k \nabla h(w_k; x_k, y_k)) =$$

$$\arg\min_{w}\left\{\frac{1}{2}\|w - (w_k - t_k \nabla h(w_k; x_k, y_k))\|^2 + t_k g(w)\right\}$$

where $t_k$ is the step size in the k-th iteration process, and $\Delta h(w_k; x_k, y_k)$ is the sub-gradient at $w=w_k$. To find the extreme point of the above objective function, i.e., its sub-gradient is set to be 0, which yields:

$$w - w_k + t_k \nabla h(w_k; x_k, y_k) + t_k w = 0$$

Combining the above two equations yields:

$$w_{k+1} = \frac{w_k - t_k \nabla h(w_k; x_k, y_k)}{1 + t_k}$$

where the stochastic sub-gradient is:

$$\nabla h(w_k; x_k, y_k) = \beta \lambda x_k \text{sign}\left(w_k^T x_k - y_k\right) \max\left(0, \left|w_k^T x_k - y_k\right| - \varepsilon\right)^{\beta-1}$$

Thus, the linear iterative formula is obtained as:

$$w_{k+1} = \frac{w_k - \beta \lambda t_k x_k \text{sign}\left(w_k^T x_k - y_k\right) \max\left(0, \left|w_k^T x_k - y_k\right| - \varepsilon\right)^{\beta-1}}{1 + t_k}$$

In practice, the following hyper-parameters need to be set: the initial value of the second weight parameters $w_0$, the step size sequence $\{t_k\}$, the order of the penalty function $\beta$, the penalty factor of the penalty function $\lambda$, and the insensitive coefficient $\varepsilon$.

Based on the linear iterative formula, it can be seen that when there is a single or a small batch of training data, the first weight parameter $w_0$ of the existing pre-trained SVR can be used as the iterative initial value. Iterative calculations can then be performed based on the obtained new training data $x_k$ and $y_k$, so that the new weight parameter can be obtained through iterative calculations using single or small batches of new training data on the basis of the already calculated first weight parameter. This not only reduces computation time but also retains past process characteristics and training results since the existing first weight parameters are used as the iterative initial value. This enables accurate prediction of the detection parameters corresponding to the process parameters, thereby improving the accuracy of optimizing the process parameters.

In a possible embodiment of the prevent invention, another method for calculating the second weight parameter is provided, which includes:

calculate the second weight parameter by using a nonlinear iterative formula with the first weight parameter as the iterative initial value when the pre-trained support vector regression model is a nonlinear support vector regression model. The nonlinear iterative formula is:

$$w_{k+1} = \frac{w_k - \beta \lambda t_k \phi(x_k) \text{sign}\left(w_k^T \phi(x_k) - y_k\right) \max\left(0, \left|w_k^T \phi(x_k) - y_k\right| - \varepsilon\right)^{\beta-1}}{1 + t_k}$$

where $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, $\varepsilon$ represents an insensitive coefficient of the support vector regression model, and $\phi(x_k)$ represents a kernel mapping function.

Extending the method from the previous embodiment to the nonlinear support vector regression model, for a given training set, the nonlinear support vector regression model is denoted as $f(x)=w^T\phi(x)+b$, where $\phi(x)$ represents the kernel mapping. Similarly, for the convenience of subsequent expressions, we will expand the parameters and feature vectors are expanded as: $w=(w^{(1)}, w^{(2)}, \ldots, w^{(d)}, b)^T$, $\phi(x)=(\phi(x)^{(1)}, \phi(x)^{(2)}, \ldots, \phi(x)^{(d)}, 1)^T$, thus the nonlinear support vector regression model is $f(x)=w^T\phi(x)$. Therefore, the unconstrained optimization problem transformed using the exterior penalty function method is shown as follows:

$$\min_{w} \frac{1}{2}\|w\|^2 + \sum_{i=1}^{m} \frac{\lambda}{m} \max\left(0, \left|w^T \phi(x_i) - y_i\right| - \varepsilon\right)^{\beta} \qquad \text{(xi)}$$

Subsequently, it is transformed into the following approximate stochastic approximation problem:

$$\min_{w} E_{(X,Y)}[h(w; x, y)] + g(w)$$

$$g(w) = \frac{1}{2}\|w\|^2$$

$$h(w; x, y) = \lambda \max\left(0, \left|w^T \phi(x) - y\right| - \varepsilon\right)^\beta$$

Using the online proximal gradient algorithm to solve, the final parameter solution is:

$$w_{k+1} = \frac{w_k - \beta\lambda t_k \phi(x_k)\text{sign}(w_k^T\phi(x_k) - y_k)\max\left(0, \left|w_k^T\phi(x_k) - y_k\right| - \varepsilon\right)^{\beta-1}}{1 + t_k}$$

In practice, the following hyper-parameters need to be set: the initial value of the second weight parameters $w_0$, the step size sequence $\{t_k\}$, the order of the penalty function $\beta$, the penalty factor of the penalty function $\lambda$, the insensitive coefficient $\varepsilon$, as well as the type of kernel mapping and kernel parameters.

For the kernel mapping of nonlinear iterative formulas, since it is an explicit kernel mapping, traditional methods such as Gaussian kernels and polynomial kernels cannot be used anymore. Approximate kernel mapping methods can be employed to construct the explicit kernel mapping. Specific methods include the Taylor series method, stochastic approximation method, neural network mapping, etc.

In a possible embodiment of the present application, another method for optimizing a process parameter is provided. FIG. 2 is a flowchart of another method for optimizing a process parameter provided in the embodiment of the present application. As shown in FIG. 2, the method includes:

Step 201, use a first weight parameter of a pre-trained support vector regression model for a manufacturing equipment as an iterative initial value, and calculate a second weight parameter of a support vector regression model using an online proximal gradient algorithm based on training data;

Step 202, obtain an optimized support vector regression model by updating the first weight parameter of the pre-trained support vector regression model to the second weight parameter;

Step 203, input a first process parameter of the manufacturing equipment into the optimized support vector regression model to obtain a first detection parameter output by the optimized support vector regression model; and Step 204, calculate, according to the first process parameter and the first detection parameter, the target process parameter by using a swarm intelligence algorithm.

Specifically, the target detection parameter is firstly determined among the first detection parameters. After calculating the second weight parameters through the linear or nonlinear iterative formulas mentioned in the previous embodiments and obtaining the optimized support vector regression model, a batch of first process parameter data generated according to a certain rule is input into the optimized support vector regression model. The optimized support vector regression model outputs the corresponding first detection parameters for these process parameters, such as product quality, time consumed per unit production, and energy consumption per unit production. If the output first detection parameters are of a single type, such as time consumed per unit production, then based on the type of the first detection parameters, with the corresponding historical optimal process parameters of the manufacturing equipment as the initial position parameters for the swarm intelligence algorithm, the target process parameter is calculated through the swarm intelligence algorithm. For example, if the output first detection parameter is the time consumed per unit production, the historical optimal process parameter with the best time consumed per unit production is selected as the initial position parameter for the swarm intelligence algorithm. The purpose of this is to enable the swarm intelligence algorithm to converge faster, thereby shortening the time required for process parameter optimization.

When the first detection parameter output by the optimized support vector regression model involves multiple detection types, a multi-objective constrained optimization problem can be established based on the actual optimization goals. For example:

$$\min \mu\, f(x) + \nu g(x)$$

$$\text{s.t. } a_1 \le m_1(x) \le b_1, a_2 \le m_2(x) \le b_2, \ldots, a_t \le m_t(x) \le b_t$$

where the prediction function for energy consumption per unit product is denoted as $f(x)$, the prediction function for production time per unit product is denoted as $g(x)$, and the prediction function for product quality is denoted as $m(x)$. The hyper-parameters $\mu$ and $\nu$ are weights that can be adjusted according to actual needs. For example, when the order quantity is relatively small, the weight of the energy minimization term is increased; when the order quantity is relatively large, the weight of the time minimization term is increased.

Subsequently, based on the target optimization type of the detection parameters determined in the previous step, the target historical optimal process parameters corresponding to the target optimization type is determined from the historical optimal process parameters of the manufacturing equipment. Then, according to the first process parameter, the first detection parameter, with the target historical optimal process parameter as the initial position parameter for the swarm intelligence algorithm, the target process parameters is calculated through the swarm intelligence algorithm.

In this embodiment, the swarm intelligence algorithm can include: a genetic algorithm, a simulated annealing algorithm, an active set method, a branch and bound method, and a particle swarm optimization algorithm. In an implementation, the swarm intelligence algorithm in this embodiment is the particle swarm optimization. By setting hyper-parameters such as a swarm size, a maximum number of iterations, an inertia weight, and a personal acceleration factor, the target process parameter is trained and solved.

In a possible embodiment of the present application, an apparatus for optimizing a process parameter is provided. FIG. 3 is a schematic diagram of an apparatus for optimizing a process parameter provided in an embodiment of the present application. As shown in FIG. 3, the apparatus 30 includes:

a model training module 301, configured to:

use a first weight parameter of a pre-trained support vector regression model for a manufacturing equipment as an iterative initial value, and calculating a second weight parameter of a support vector regression model using an online proximal gradient algorithm based on training data, where the training data includes: a historical process parameter of the manufacturing equipment, and a historical detection parameter corresponding to when the manufacturing equipment operates with the historical process parameter;

obtain an optimized support vector regression model by updating the first weight parameter of the pre-trained support vector regression model to the second weight parameter;

a parameter optimization module 302, configured to:

input a first process parameter of the manufacturing equipment into the optimized support vector regression model to obtain a first detection parameter output by the optimized support vector regression model; and calculate, according to the first process parameter and the first detection parameter, a target process parameter for the manufacturing equipment.

In a possible embodiment of the present application, a device for optimizing a process parameter is provided. FIG. 4 is a schematic diagram of a device for optimizing a process parameter provided in an embodiment of the present application. As shown in FIG. 4, the device 40 includes:

a memory 401, a processor 402, an interaction interface 403, where the memory 401, the processor 402, and the interaction interface 403 are connected through a bus 404;

the memory 401 is configured to store a computer program;

the processor 402 is configured to execute the computer program stored in the memory to implement the method for optimizing a process parameter.

The specific implementation process of the processor 402 can be referred to the aforementioned method embodiments. The implementation principles and technical effects therebetween are similar, and thus will not be repeated here in this embodiment.

In the embodiment depicted in FIG. 4, it should be noted that the processor may either be a Central Processing Unit (English: Central Processing Unit, abbreviation: CPU) or other general-purpose processors, a Digital Signal Processor (English: Digital Signal Processor, abbreviation: DSP), an Application Specific Integrated Circuit (English: Application Specific Integrated Circuit, abbreviation: ASIC), and the like. The general-purpose processor can be a microprocessor, or it can be any conventional processor, etc. The steps of the method disclosed in conjunction with the invention can be directly implemented by hardware processors or executed through a combination of hardware and software modules in the processor.

The memory may include a random access memory (Random Access Memory, RAM) and may also include a non-volatile memory (Non-volatile Memory, NVM), such as at least one disk memory.

The bus can be an industry standard architecture (Industry Standard Architecture, ISA) bus, a peripheral component interconnect (Peripheral Component Interconnect, PCI) bus, an extended industry standard architecture (Extended Industry Standard Architecture, EISA) bus, etc. Buses can be classified into address buses, data buses, control buses, etc. For simplicity of representation, the buses in the drawings of the present application are not limited to only one bus or one type of bus.

In a possible embodiment of the present application, a readable storage medium is also provided, on which a computer program is stored; the computer program is used for implementing the method for optimizing a process parameter.

The computer readable storage medium can be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a disk memory, a flash memory, a disk or an optical disc. The readable storage medium can be any available medium that can be accessed by a general-purpose or special-purpose computer.

An exemplary readable storage medium is coupled to a processor, enabling the processor to read information from and write information to the readable storage medium. Of course, the readable storage medium can also be an integral part of the processor. The processor and the readable storage medium can be located within the application specific integrated circuit (Application Specific Integrated Circuit, ASIC). Alternatively, the processor and the readable storage medium can exist as separate components within the device.

The division of the units is purely based on logical functions, and there may be alternative division methods in actual implementation. For instance, multiple units or components can be combined or integrated into another system, or certain features can be omitted or not executed. Additionally, the coupling, direct coupling, or communication connection displayed or discussed may be achieved through indirect coupling or communication connections via interfaces, apparatuses, or units, which can take the form of electrical, mechanical, or other types of connections.

The units described as separate components may or may not be physically separated. The components displayed as units may or may not be physical units, meaning they can be located in one place or distributed across multiple network units. Depending on actual needs, some or all of the units can be selected to achieve the purpose of the embodiment.

Additionally, in various embodiments of the present invention, the functional units can be integrated into a single processing unit, or each unit can exist as a separate physical entity, or two or more units can be integrated into a single unit.

If the functions are implemented in the form of software functional units and sold or used as independent products, they can be stored in a computer-readable storage medium. Based on this understanding, the technical solution of the present invention, in essence or the part that contributes to the prior art, or part of this technical solution, can be embodied in the form of a software product. This computer software product is stored in a storage medium and includes instructions for causing a computer (which can be a personal computer, a server, a network device, etc.) to execute all or part of the steps of the methods described in various embodiments of the present invention. The aforementioned storage medium includes various media that can store a program code, such as a USB flash disk, a mobile hard disk, a read-only memory (ROM, Read-Only Memory), a random access memory (RAM, Random Access Memory), a disk or an optical disc, etc.

It will be appreciated by those skilled in the art that all or some of the steps to implement each of the foregoing method embodiments may be accomplished by hardware associated with program instructions. The foregoing program may be stored in a computer-readable storage medium. The program, when executed, performs the steps included in the above-described method embodiments; and the foregoing storage medium includes: a ROM, a RAM, a disk or an optical disc, and various other media that can store program code.

Up to this point, the technical solution of the present application has been described in conjunction with the preferred embodiments shown in the accompanying drawings. However, it is easily understood by those skilled in the art that the scope of protection of the present application is not limited to these specific embodiments. The above embodiments are merely used to illustrate, rather than limit, the technical solution of the present application. Although the present application has been described in detail with reference to the embodiments, ordinary technicians in the art should understand that they can still modify the technical solutions recorded in the embodiments or replace some or all of the technical features with equivalent ones. These modifications or replacements do not cause the essence of the corresponding technical solutions to deviate from the scope of the technical solutions of the embodiments of the present application.

What is claimed is:

1. A method for optimizing a process parameter, applied to a server, comprising:

using, by a hardware processor of the server, a first weight parameter of a pre-trained support vector regression model for a manufacturing equipment as an iterative initial value, and calculating a second weight parameter of a support vector regression model using an online proximal gradient algorithm based on training data, wherein the training data comprises: a historical process parameter of the manufacturing equipment, and a historical detection parameter corresponding to when the manufacturing equipment operates with the historical process parameter;

obtaining, by the hardware processor, an optimized support vector regression model by updating the first weight parameter of the pre-trained support vector regression model to the second weight parameter;

inputting, by the hardware processor, a first process parameter of the manufacturing equipment into the optimized support vector regression model to obtain a first detection parameter output by the optimized support vector regression model; and calculating, by the hardware processor, according to the first process parameter and the first detection parameter, a target process parameter for the manufacturing equipment;

wherein the using, by the hardware processor, the first weight parameter of the pre-trained support vector regression model for the manufacturing equipment as the iterative initial value, and calculating the second weight parameter of the support vector regression model using the online proximal gradient algorithm based on the training data comprises:

calculating, by the hardware processor, the second weight parameter by using a linear iterative formula with the first weight parameter as the iterative initial value when the pre-trained support vector regression model is a linear support vector regression model, and the linear iterative formula is:

$$w_{k+1} = \frac{w_k - \beta \lambda t_k \phi(x_k) \mathrm{sign}\!\left(w_k^T \phi(x_k) - y_k\right) \max\!\left(0,\ \left|w_k^T \phi(x_k) - y_k\right| - \varepsilon\right)^{\beta-1}}{1 + t_k};$$

or calculating, by the hardware processor, the second weight parameter by using a nonlinear iterative formula with the first weight parameter as the iterative initial value when the pre-trained support vector regression model is a nonlinear support vector regression model, and the nonlinear iterative formula is:

$$w_{k+1} = \frac{w_k - \beta \lambda t_k x_k \mathrm{sign}\!\left(w_k^T x_k - y_k\right) \max\!\left(0,\ \left|w_k^T x_k - y_k\right| - \varepsilon\right)^{\beta-1}}{1 + t_k};$$

wherein $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, $\varepsilon$ represents an insensitive coefficient of the support vector regression model, and $\phi(x_k)$ represents a kernel mapping function.

2. The method according to claim 1, wherein calculating, by the hardware processor, according to the first process parameter and the first detection parameter, the target process parameter for the manufacturing equipment comprises:

calculating, by the hardware processor, according to the first process parameter and the first detection parameter, the target process parameter by using a swarm intelligence algorithm.

3. The method according to claim 2, wherein calculating, by the hardware processor, according to the first process parameter and the first detection parameter, the target process parameter by using the swarm intelligence algorithm comprises:

calculating, by the hardware processor, according to the first process parameter and the first detection parameter, with a historical optimal process parameter of the manufacturing equipment as an initial position parameter for the swarm intelligence algorithm, the target process parameter through the swarm intelligence algorithm.

4. The method according to claim 3, wherein calculating, by the hardware processor, according to the first process parameter and the first detection parameter, with the historical optimal process parameter of the manufacturing equipment as the initial position parameter for the swarm intelligence algorithm, the target process parameter through the swarm intelligence algorithm comprises:

determining, by the hardware processor, according to a target optimization type of the first detection parameter, a target historical optimal process parameter corresponding to the target optimization type in the historical optimal process parameter of the manufacturing equipment; and calculating, by the hardware processor, according to the first process parameter and the first detection parameter, with the target historical optimal process parameter as the initial position parameter for the swarm intelligence algorithm, the target process parameter through the swarm intelligence algorithm.

5. The method according to claim 4, wherein calculating, by the hardware processor, according to the first process parameter and the first detection parameter, with the target historical optimal process parameter as the initial position parameter for the swarm intelligence algorithm, the target process parameter through the swarm intelligence algorithm comprises:

calculating, by the hardware processor, according to the first process parameter and the first detection parameter, with the target historical optimal process parameter as an initial position parameter for a particle swarm optimization algorithm, the target process parameter through the particle swarm optimization algorithm.

6. A device for optimizing a process parameter, comprising:

a processor and a memory;

the memory is configured to store a computer program; and the processor is configured to execute the computer program stored in the memory to:

use a first weight parameter of a pre-trained support vector regression model for a manufacturing equipment as an iterative initial value, and calculate a second weight parameter of a support vector regression model using an online proximal gradient algorithm based on training data, wherein the training data comprises: a historical process parameter of the manufacturing equipment, and a historical detection parameter corresponding to when the manufacturing equipment operates with the historical process parameter;

obtain an optimized support vector regression model by updating the first weight parameter of the pre-trained support vector regression model to the second weight parameter;

input a first process parameter of the manufacturing equipment into the optimized support vector regression model to obtain a first detection parameter output by the optimized support vector regression model; and calculate, according to the first process parameter and the first detection parameter, a target process parameter for the manufacturing equipment;

wherein the processor is further configured to:

calculate the second weight parameter by using a linear iterative formula with the first weight parameter as the iterative initial value when the pre-trained support vector regression model is a linear support vector regression model, and the linear iterative formula is:

$$w_{k+1} = \frac{w_k - \beta\lambda t_k \phi(x_k)\,\mathrm{sign}\!\left(w_k^T\phi(x_k) - y_k\right)\max\!\left(0,\ \left|w_k^T\phi(x_k) - y_k\right| - \varepsilon\right)^{\beta-1}}{1 + t_k};$$

or calculate the second weight parameter by using a nonlinear iterative formula with the first weight parameter as the iterative initial value when the pre-trained support vector regression model is a nonlinear support vector regression model, and the nonlinear iterative formula is:

$$w_{k+1} = \frac{w_k - \beta\lambda t_k x_k\,\mathrm{sign}\!\left(w_k^T x_k - y_k\right)\max\!\left(0,\ \left|w_k^T x_k - y_k\right| - \varepsilon\right)^{\beta-1}}{1 + t_k};$$

wherein $w_{k+1}$ represents a $(k+1)$-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, $\varepsilon$ represents an insensitive coefficient of the support vector regression model, and $\phi(x_k)$ represents a kernel mapping function.

7. The device according to claim 6, wherein the processor is further configured to:

calculate, according to the first process parameter and the first detection parameter, the target process parameter by using a swarm intelligence algorithm.

8. The device according to claim 7, the processor is further configured to:

calculate, according to the first process parameter and the first detection parameter, with a historical optimal process parameter of the manufacturing equipment as an initial position parameter for the swarm intelligence algorithm, the target process parameter through the swarm intelligence algorithm.

9. The device according to claim 8, wherein the processor is further configured to:

determine, according to a target optimization type of the first detection parameter, a target historical optimal process parameter corresponding to the target optimization type in the historical optimal process parameter of the manufacturing equipment; and calculate, according to the first process parameter and the first detection parameter, with the target historical optimal process parameter as the initial position parameter for the swarm intelligence algorithm, the target process parameter through the swarm intelligence algorithm.

10. The device according to claim 9, wherein the processor is further configured to:

calculate, according to the first process parameter and the first detection parameter, with the target historical optimal process parameter as an initial position parameter for a particle swarm optimization algorithm, the target process parameter through the particle swarm optimization algorithm.

11. A non-transitory readable storage medium, wherein the readable storage medium stores a computer program; the computer program is used for implementing the following steps:

using a first weight parameter of a pre-trained support vector regression model for a manufacturing equipment as an iterative initial value, and calculating a second weight parameter of a support vector regression model using an online proximal gradient algorithm based on training data, wherein the training data comprises: a historical process parameter of the manufacturing equipment, and a historical detection parameter corresponding to when the manufacturing equipment operates with the historical process parameter;

obtaining an optimized support vector regression model by updating the first weight parameter of the pre-trained support vector regression model to the second weight parameter;

inputting a first process parameter of the manufacturing equipment into the optimized support vector regression model to obtain a first detection parameter output by the optimized support vector regression model; and calculating, according to the first process parameter and the first detection parameter, a target process parameter for the manufacturing equipment;

wherein using the first weight parameter of the pre-trained support vector regression model for the manufacturing equipment as the iterative initial value, and calculating the second weight parameter of the support vector regression model using the online proximal gradient algorithm based on the training data comprises:

calculating, by the hardware processor, the second weight parameter by using a linear iterative formula with the first weight parameter as the iterative initial value when the pre-trained support vector regression model is a linear support vector regression model, and the linear iterative formula is:

$$w_{k+1} = \frac{w_k - \beta \lambda t_k \phi(x_k) \mathrm{sign}\left(w_k^T \phi(x_k) - y_k\right) \max\left(0, \left|w_k^T \phi(x_k) - y_k\right| - \varepsilon\right)^{\beta-1}}{1 + t_k};$$

or calculating, by the hardware processor, the second weight parameter by using a nonlinear iterative formula with the first weight parameter as the iterative initial value when the pre-trained support vector regression model is a nonlinear support vector regression model, and the nonlinear iterative formula is:

$$w_{k+1} = \frac{w_k - \beta \lambda t_k x_k \mathrm{sign}\left(w_k^T x_k - y_k\right) \max\left(0, \left|w_k^T x_k - y_k\right| - \varepsilon\right)^{\beta-1}}{1 + t_k};$$

wherein $w_{k+1}$ represents a (k+1)-th second weight parameter, $w_k$ represents a k-th second weight parameter, an initial second weight parameter $w_0$ is the first weight parameter, $t_k$ represents a step size for a k-th iteration, $\beta$ represents an order of a penalty function, $\lambda$ represents a penalty factor of the penalty function, $x_k$ represents the historical process parameter, $y_k$ represents the historical detection parameter corresponding to $x_k$, $\varepsilon$ represents an insensitive coefficient of the support vector regression model, and $\phi(x_k)$ represents a kernel mapping function.

12. The non-transitory readable storage medium according to claim 11, wherein the computer program is further used for implementing the following step:

calculating, according to the first process parameter and the first detection parameter, the target process parameter by using a swarm intelligence algorithm.

13. The non-transitory readable storage medium according to claim 12, wherein the computer program is further used for implementing the following step:

calculating, according to the first process parameter and the first detection parameter, with a historical optimal process parameter of the manufacturing equipment as an initial position parameter for the swarm intelligence algorithm, the target process parameter through the swarm intelligence algorithm.

14. The non-transitory readable storage medium according to claim 13, wherein the computer program is further used for implementing the following steps:

determining, according to a target optimization type of the first detection parameter, a target historical optimal process parameter corresponding to the target optimization type in the historical optimal process parameter of the manufacturing equipment; and calculating, according to the first process parameter and the first detection parameter, with the target historical optimal process parameter as the initial position parameter for the swarm intelligence algorithm, the target process parameter through the swarm intelligence algorithm.

15. The method according to claim 1, wherein before using, by the hardware processor of the server, the first weight parameter of the pre-trained support vector regression model for a manufacturing equipment as the iterative initial value, and calculating the second weight parameter of the support vector regression model using the online proximal gradient algorithm based on the training data, the method further comprises:

performing, by the hardware processor, data screening, feature selection, and feature normalization on the training data.

16. The device according to claim 6, wherein the processor is further configured to:

perform data screening, feature selection, and feature normalization on the training data before using the first weight parameter of the pre-trained support vector regression model for the manufacturing equipment as the iterative initial value, and calculating the second weight parameter of the support vector regression model using the online proximal gradient algorithm based on the training data.

17. The non-transitory readable storage medium according to claim 11, wherein before using the first weight parameter of the pre-trained support vector regression model for the manufacturing equipment as the iterative initial value, and calculating the second weight parameter of the support vector regression model using the online proximal gradient algorithm based on the training data, the computer program is further used for implementing the following step:

performing data screening, feature selection, and feature normalization on the training data.

18. The method according to claim 1, wherein the method further comprises:

enabling, by the hardware processor, the manufacturing equipment to produce according to the target process parameter.

19. The device according to claim 6, wherein the processor is further configured to:

enable the manufacturing equipment to produce according to the target process parameter.

20. The non-transitory readable storage medium according to claim 11, the computer program is further used for implementing the following step:

enabling the manufacturing equipment to produce according to the target process parameter.

* * * * *